(12) United States Patent
Ehm et al.

(10) Patent No.: US 12,332,576 B2
(45) Date of Patent: Jun. 17, 2025

(54) METHOD FOR MAINTAINING A PROJECTION EXPOSURE APPARATUS, SERVICE MODULE AND ARRANGEMENT FOR SEMICONDUCTOR LITHOGRAPHY

(71) Applicant: Carl Zeiss SMT GmbH, Oberkochen (DE)

(72) Inventors: Dirk Heinrich Ehm, Beckingen (DE); Jens Kugler, Aalen (DE); Benjahman Julius Modeste, Elchingen (DE); Marwene Nefzi, Ulm (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 196 days.

(21) Appl. No.: 17/986,517

(22) Filed: Nov. 14, 2022

(65) Prior Publication Data

US 2023/0072843 A1    Mar. 9, 2023

Related U.S. Application Data

(63) Continuation of application No. PCT/EP2021/060328, filed on Apr. 21, 2021.

(30) Foreign Application Priority Data

May 18, 2020   (DE) .......................... 102020206249.8

(51) Int. Cl.
*G03F 7/00*    (2006.01)
(52) U.S. Cl.
CPC ................................ *G03F 7/70975* (2013.01)

(58) Field of Classification Search
CPC ............. G03F 7/70975; G03F 7/70925; G03F 7/70258
See application file for complete search history.

(56) References Cited

U.S. PATENT DOCUMENTS

| | | | |
|---|---|---|---|
| 2003/0179357 A1* | 9/2003 | Ravensbergen | G03F 7/70258 430/311 |
| 2006/0028628 A1 | 2/2006 | Lin et al. | |
| 2007/0132989 A1* | 6/2007 | Kaller | G01N 21/94 356/239.1 |

(Continued)

FOREIGN PATENT DOCUMENTS

| | | |
|---|---|---|
| DE | 10 2017 212 352 A1 | 7/2018 |
| DE | 10 2008 040 720 A1 | 1/2020 |
| JP | H11-162831 A | 6/1999 |

OTHER PUBLICATIONS

International Search Report for the corresponding PCT Application No. PCT/EP2021/060328, mailed Jul. 27, 2021.

(Continued)

*Primary Examiner* — Steven H Whitesell
(74) *Attorney, Agent, or Firm* — Fish & Richardson P.C.

(57) ABSTRACT

A method for maintaining a projection exposure apparatus comprising at least two modules and a reference element, wherein the modules are referenced to the reference element, comprises: removing a module; attaching a service module to or in the vicinity of the projection exposure apparatus; referencing the service module to the reference element of the projection exposure apparatus; and implementing a maintenance measure with the aid of the service module.

22 Claims, 4 Drawing Sheets

(56) References Cited

U.S. PATENT DOCUMENTS

| | | | |
|---|---|---|---|
| 2007/0163715 A1* | 7/2007 | Rastegar | H01L 21/67051 |
| | | | 156/345.5 |
| 2008/0212083 A1* | 9/2008 | Kwan | G03F 7/70775 |
| | | | 356/124 |
| 2009/0237634 A1 | 9/2009 | Eussen et al. | |
| 2010/0208230 A1* | 8/2010 | Rath | G03F 7/70258 |
| | | | 356/614 |
| 2011/0164232 A1* | 7/2011 | Freimann | G03F 7/70491 |
| | | | 250/206 |
| 2013/0235359 A1 | 9/2013 | Fujiwara et al. | |

OTHER PUBLICATIONS

German Office Action, with translation thereof, for corresponding DE Appl 10 2020 206 249.8, dated Dec. 2, 2020.
Taiwanese Office Action and Search Report, with translation therein, for corresponding TW Appl No. 110115042, dated Dec. 19, 2024.

* cited by examiner

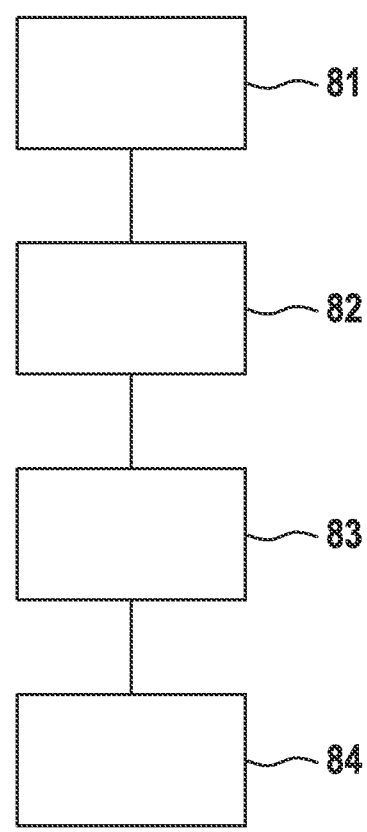

METHOD FOR MAINTAINING A PROJECTION EXPOSURE APPARATUS, SERVICE MODULE AND ARRANGEMENT FOR SEMICONDUCTOR LITHOGRAPHY

CROSS-REFERENCE TO RELATED APPLICATIONS

The present application is a continuation of, and claims benefit under 35 USC 120 to, international application PCT/EP2021/060328, filed Apr. 21, 2021, which claims benefit under 35 USC 119 of German Application No. 10 2020 206 249.8, filed May 18, 2020. The entire disclosure of these applications are incorporated by reference herein.

FIELD

The disclosure relates to a method for maintaining a projection exposure apparatus, a service module and an arrangement for semiconductor lithography.

BACKGROUND

Projection exposures apparatuses are used for producing extremely fine structures, for example on semiconductor components or other microstructured component parts. The operating principle of the apparatuses is based on the production of extremely fine structures down to the nanometre range by way of generally reducing imaging of structures on a mask, a so-called reticle, on an element to be structured that is provided with photosensitive material. The minimum dimensions of the structures produced are directly dependent on the wavelength of the light used. Recently, light sources having an emission wavelength in the range of a few nanometres, for example between 5 nm and 120 nm, for example in the region of 13.5 nm, have increasingly been used. The described wavelength range is also referred to as the EUV range.

These highly complex projection exposure apparatuses, for example for the EUV range, comprise inter alia an illumination optical unit and a projection optical unit, which are embodied as mechatronic systems and thus have actuators, sensors and also cooling and decoupling systems. Projection optical units typically have 6 to 10 mirrors, a large portion of the mirrors being adjustable in up to six degrees of freedom. As a result, these systems can include up to 60 actuators and more than 100 sensors. Besides the highly accurate sensors for mirror positioning, a large number of sensors are used for temperature measurements, system start, acceleration measurements and further detection of physical properties. On account of the large number of systems and subsystems and the highly sensitive optical elements, it should be assumed that faults in the mechatronic systems or degradation of the optical elements could occur during the lifetime, thus involving exchange or repair.

The present disclosure seeks to specify a method for maintaining components in a projection lens and in a projection exposure apparatus. The disclosure also seeks to provide a device which allows simplified maintenance or simplified exchange of components.

A method according to the disclosure for maintaining a projection exposure apparatus comprising at least two modules and a reference element, wherein the modules are referenced to the reference element, comprises the following method steps:

Removing a module.

Attaching a service module to or in the vicinity of the projection exposure apparatus.

Referencing the service module to the reference element of the projection exposure apparatus.

Implementing a maintenance measure with the aid of the service module.

For example, the module can be a part of a projection optical unit or of an illumination optical unit.

In this case, referencing the service module can be effected on the basis of a reference mark of the projection exposure apparatus. A reference mark can be embodied as a mechanical or an optical reference mark and serves for establishing a connection between the coordinate system of the service module and that of the projection exposure apparatus. As a result, the positions of all the modules arranged in the projection exposure apparatus and of their component parts are known in the coordinate system of the service module, as a result of which collision and damage of parts of the projection exposure apparatus can be avoided.

For example, the reference mark can correspond to a reference mark of one of the modules. This can allow a service module to be used even in the case of projection exposure apparatuses that have already been delivered.

Furthermore, as a result of removing a module, at least one further module can become accessible for an inspection. Depending on the embodiment of the projection exposure apparatus, the projection optical unit thereof or the illumination optical unit thereof, it is also possible for a plurality of modules to be reached from a position of the service module. Expediently, each maintenance measure can be implemented from at least one position of the service module.

In addition, the service module can be exchanged for implementing different maintenance measures.

For example, the maintenance measures can comprise one or more of the following measures:

Examination of contamination, such as, for example, via ellipsometry or X-ray fluorescence, also known as XRF, or with the aid of an atomic force microscope, also known as AFM, or via of microscopy, removal of particles or deposits from optical surfaces, interferometer measurement, non-contact detection of mechanical stresses or strains, non-contact and/or non-destructive material testing, corrosion testing or crack detection of frame parts of the carrying structures, detection of the reference mark.

This list is not exhaustive and can encompass, in general, all maintenance work that can be carried out by a service head of the arrangement.

Furthermore, by attaching a sealing bell enclosing the service module, the projection exposure apparatus can be closed in a vacuum-tight manner. In this case, the sealing bell can be connected to an existing interface of the projection exposure apparatus.

For example, the weight and/or the moments of inertia of the service module and/or of the sealing bell can be designed in such a way that they correspond to those of the removed module. It is thereby possible to avoid changes in the stresses in the carrying structure as a result of deformations on account of different weights and moments of inertia. As a result, the system can behave mechanically almost identically to the projection exposure apparatus during operation, as a result of which dynamic measurements are also conceivable.

A service module according to the disclosure for maintenance or inspection of components of a projection exposure apparatus for semiconductor lithography comprises a device for detecting a reference mark of the projection exposure apparatus. In this context, detecting the reference mark should be understood to mean that the device can determine the position of the reference mark in the coordinate system of the service module. As already described further above, the reference mark can be embodied as a mechanical or an optical mark, but also in general as a mark based on some other physical principle. The position of the device for detecting the reference mark in the coordinate system of the service module is known in this case. As a result, referencing the service module can be realized independently of the position of the service module at or in the vicinity of the projection exposure apparatus.

In the case of an optical reference mark, the device for detecting the reference mark can be embodied as a camera. Using subsequent image evaluation, the camera can recognize the reference mark and determine the position thereof in the coordinate system of the service module.

In the case of a mechanical reference mark, the device for detecting the reference mark can comprise a probe head. In this case, the service module can comprise an arm, at the tip of which the probe head can be arranged. The probe head can probe the reference mark, in a manner comparable to a coordinate measuring machine, and thereby establish the relationship between the coordinate systems of the service module and the projection exposure apparatus. The arrangement, size, position and orientation of the components in the projection exposure apparatus are stored in the controller of the service module, as a result of which it is possible to ensure a safe method in the projection exposure apparatus.

Furthermore, the service module can comprise an exchangeable service head. The different service heads can comprise a multiplicity of different tools, sensors or cleaning devices, wherein the service head can be exchanged depending on the task during the service of the projection exposure apparatus. The inspection heads can comprise metrology for examining contamination, such as, for example, ellipsometry or x-ray fluorescence, also known as XRF, or an atomic force microscope (AFM) or an optical microscope, cleaning heads for removing particles or deposits from optical surfaces, interferometers, non-contact metrology for detecting mechanical stresses or strains, measuring instruments for non-contact and non-destructive material testing, corrosion testing or crack detection for examining frame parts of the carrying structures. It is also conceivable for the device for detecting the reference mark to be embodied as a service head. After the service module has been successfully referenced, the service head can be exchanged for example for a service head having an optical sensor for detecting contamination on the optical surfaces. The internal sensors of the service module generally allow the service head to be positioned with sufficient accuracy of 50 µm-100 µm in the projection exposure apparatus. If the internal sensors are not accurate enough to achieve the desired positioning accuracy, for example distance sensors can be attached to the arm of the service module in order to indicate possible collisions and thereby to serve as additional safety. During repair work, for example cleaning of the surface of the optical elements, the contact force can for example also be monitored by way of a force sensor.

For example, the service module can comprise a robot arm. In this context, a robot arm should be understood to mean a kinematic system that can move in space. In the case of a robot arm having a plurality of degrees of freedom, for example six degrees of freedom, which robot arm can move virtually freely in space, the service head arranged on the end effector can reach virtually any position within the projection exposure apparatus. By virtue of the plurality of axes of the robot arms, it is also possible for example to move to surfaces of optical elements from various angles. It is also conceivable that depending on the position of the region to be examined between service module and interface in the projection exposure apparatus an adapter is arranged, such that the range of the robot arm is increased; it goes without saying that the robot arm itself or the kinematic system in this case can also be lengthened or chosen with appropriate length.

Furthermore, the robot arm can be at least partly enclosed by an elastic sheath in order to avoid contamination. The introduction of particles into the projection exposure apparatus by the robot arm with its moving sub-arms and joints can be virtually precluded by the elastic sheath enclosing at least all moving parts of the robot arm. In this case, the sheath itself does not restrict the movement of the robot arm.

An arrangement according to the disclosure for semiconductor lithography comprises a projection exposure apparatus having at least two modules and a reference element, which can be a sensor frame or a carrying frame or else any other suitable component part. In this case, the modules are referenced vis-à-vis the reference element, i.e. the position and orientation of the modules are known in the coordinate system of the reference element. Furthermore, the arrangement comprises a service module, which according to the disclosure is referenced to the reference element of the projection exposure apparatus. In this case, the service module can be connected to the projection exposure apparatus in place of one of the two modules embodied for example as modules of a projection optical unit of the projection exposure apparatus. With the aid of the service module, it is possible to carry out various tasks of maintenance, such as, for example, testing of the optical surfaces, detection of damage within the projection exposure apparatus, for example in the projection optical unit or the illumination optical unit, and maintenance or repair of component parts. Referencing the service module to the reference element can allow the respective position of the respective modules or components of the projection exposure apparatus to be known in the coordinate system of the service module, since a relationship between the coordinate system of the service module and that of the reference element is established by way of the referencing.

In this way, it is possible to ensure that damage of the sensitive optical surfaces, actuators, sensors or other component parts as a result of a collision with the service module is avoidable. Furthermore, the position of possible damage at an optically active surface (that is to say a surface which, during the operation of the apparatus, is usually impinged on by the electromagnetic radiation used for the imaging), which position is known in the coordinate system of the reference element and can be determined with the aid of the projection exposure apparatus on the basis of an optical measurement, can be headed for directly by the service module.

Furthermore, the projection exposure apparatus can comprise at least one reference mark for referencing the service module to the reference element, wherein the reference mark can be in a known relationship with the usually central reference element of the projection exposure apparatus. The reference mark can be embodied for example as a mechanical or an optical reference mark on the reference element. This can help enable accurate positioning of the service module in the space to be examined of the projection exposure apparatus in order to avoid collisions. In the case of a mechanical reference mark, the latter can be embodied as a corner of a space, for example, which can be probed by the service module, in a manner comparable to a measurement in a coordinate measuring machine. In the case of an optical reference mark, the latter can be embodied as a cross or a simple circle having known geometry, the position and orientation of which can be determined via a camera on the basis of the size, geometry and shading of the surface.

For example, the reference mark can correspond to a reference mark for positioning the modules. The modules are oriented highly accurately in the range of a few μm during mounting, for which purpose mechanical reference marks can be arranged on a carrying frame of the modules.

In this case, the reference mark can be embodied as a ball-hole interface. The latter comprises on one side of the interface, arranged at the reference element, for example, a pin, the lateral surface of which is embodied as a spherical surface. The pin can be arranged on a plate positioned by way of a spacer process in terms of its orientation and position in the range of a few micrometres. The matching counterpart of the interface, which can be arranged at the module or the service module, comprises a highly accurate socket, into which the spherical surface of the pin can be inserted during mounting. It is thereby possible to realize positioning and orientation of the module or service module with respect to the reference element with a tolerance in the range of less than 20 μm.

In one embodiment of the disclosure, the service module can be connected to the projection exposure apparatus on a carrying frame for a module during use of the service module. This can avoid providing additional interfaces and additional structural space in the projection exposure apparatus. Furthermore, the service module can find application even for projection exposure apparatuses of previous generations, in the development of which such a service module had not yet been provided.

In addition, the service module can be surrounded by a sealing bell connected to the projection exposure apparatus. Conditions similar to or the same as those during operation of the projection exposure apparatus may be desirable for some maintenance tasks. The sealing bell closes off the projection exposure apparatus in such a way that it is possible to attain environmental conditions, such as vacuum, for example, comparable with operation of the projection exposure apparatus.

Exemplary embodiments and variants of the disclosure are explained in more detail below with reference to the drawing.

BRIEF DESCRIPTION OF THE DRAWINGS

In the Figures:

FIG. 5 shows a flow diagram for a method according to the disclosure for maintaining a projection exposure apparatus.

EXEMPLARY EMBODIMENTS

Figure 1:
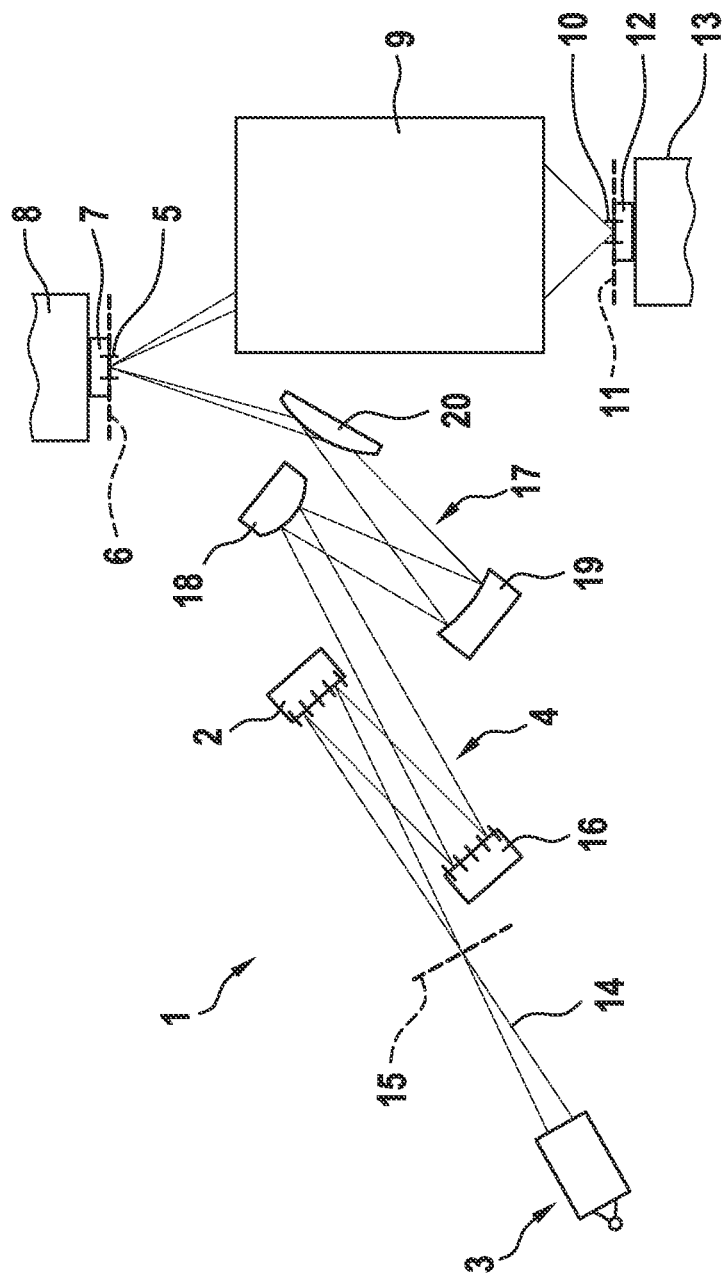
FIG. 1 shows a basic set-up of a projection exposure apparatus in which the disclosure can be realized.

FIG. 1 shows by way of example the basic set-up of a microlithographic EUV projection exposure apparatus 1 in which the disclosure can find application. An illumination system of the projection exposure apparatus 1 has, in addition to a light source 3, an illumination optical unit 4 for the illumination of an object field 5 in an object plane 6. EUV radiation 14 in the form of optical used radiation generated by the light source 3 is aligned via a collector, which is integrated in the light source 3, in such a way that it passes through an intermediate focus in the region of an intermediate focal plane 15 before it is incident on a field facet mirror 2. Downstream of the field facet mirror 2, the EUV radiation 14 is reflected by a pupil facet mirror 16. With the aid of the pupil facet mirror 16 and an optical assembly 17 having mirrors 18, 19 and 20, field facets of the field facet mirror 2 are imaged into the object field 5.

A reticle 7 arranged in the object field 5 and held by a schematically illustrated reticle holder 8 is illuminated. A merely schematically illustrated projection optical unit 9 serves for imaging the object field 5 into an image field 10 in an image plane 11. A structure on the reticle 7 is imaged on a light-sensitive layer of a wafer 12 arranged in the region of the image field 10 in the image plane 11 and held by a likewise partly represented wafer holder 13. The light source 3 can emit used radiation for example in a wavelength range of between 5 nm and 120 nm.

The disclosure can likewise be used in a DUV apparatus, which is not illustrated. A DUV apparatus is set up in general like the above-described EUV apparatus 1, wherein mirrors and lens elements can be used as optical elements in a DUV apparatus and the light source of a DUV apparatus emits used radiation in a wavelength range of 100 nm to 300 nm.

Figure 2:
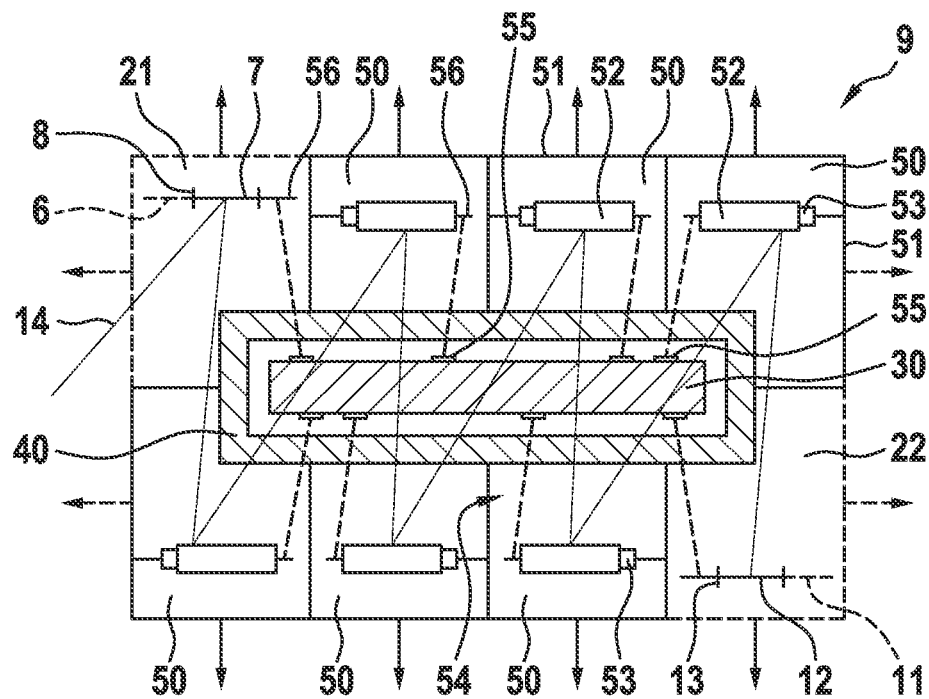
FIG. 2 shows a sectional illustration of a basic set-up of a modularly constructed projection optical unit.

FIG. 2 shows, in a sectional illustration, a basic set-up of a modularly constructed projection optical unit 9 illustrated in FIG. 1. The projection optical unit 9 comprises six optical modules 50 having optical elements embodied as mirrors 52 in the example shown and is connected to a reticle module 21 and a wafer module 22. In this case, the mirrors 52 are each connected to a module carrying frame 51 via actuators 53, via which the position and orientation of the mirrors can be set.

The EUV radiation 14 emitted by the light source 3 illustrated in FIG. 1 and guided onto the reticle 7 by way of the illumination optical unit 4 likewise illustrated in FIG. 1 is reflected at the reticle 7 and is reflected by the individual modules 50 via the mirrors 52 and is imaged onto the wafer 12. The reticle 7 is arranged in a reticle holder 8 and can be moved with the latter parallel to the object plane 6. The wafer 12 is arranged in a wafer holder 13 and can likewise be moved parallel to the image plane 11.

The modules 50, 21, 22 are arranged around a central reference element embodied as a sensor frame 30 and are connected to a carrying frame 40, which itself receives the modules 50, 21, 22. The modules 50, 21, 22 can also additionally be connected among one another. In this case, the modules 50, 21, 22 are embodied such that they can be separated from the projection optical unit 9 in the direction of the arrows, not designated separately in the figure, without any other module 50, 21, 22 having to be altered as a result. The remaining modules 50, 21, 22 do not have to be calibrated or oriented anew after the demounted module 50, 21, 22 or an identical replacement module 50, 21, 22 has been reinstalled, with the result that only the exchanged module 50, 21, 22 has to be calibrated anew, if appropriate.

Arrangements of the modules 50, 21, 22 are also conceivable in which, for an optical module 50 arranged for example further in the direction of the sensor frame 30 in the interior of the projection optical unit 9, firstly a first module 50, 21, 22 situated further out has to be demounted. As already mentioned, the modules 50, 21, 22 are embodied such that they themselves can be demounted and installed again without the other modules 50, 21, 22 being influenced.

The optical modules 50 comprise at least one sensor 54, wherein the latter comprises a sensor element 56 and a sensor reference 55. While the sensor element 56 is arranged on the optical element 52, the sensor reference 55 is arranged on the sensor frame 30. Using the sensors 54, it is thus possible to determine the position and orientation of the optical element with respect to the sensor frame 30 and thus with respect to all other optical modules 50, the reticle module 21 and the wafer module 22. In this case, the sensors 54 can be embodied for example as interferometers or as encoders. The sensor frame 30 and the carrying frame 40 are mechanically decoupled from one another (not illustrated), such that reaction forces of the actuators 53 cannot dynamically excite the sensor frame 30. The sensor frame 30 and the carrying frame 40 are additionally also mounted in a decoupled manner vis-à-vis the projection exposure apparatus 1 illustrated in FIG. 1, as a result of which excitations from the ground or other systems of the projection exposure apparatus 1 have no or only a negligibly small influence on the imaging quality of the projection exposure apparatus 1.

Figure 3:
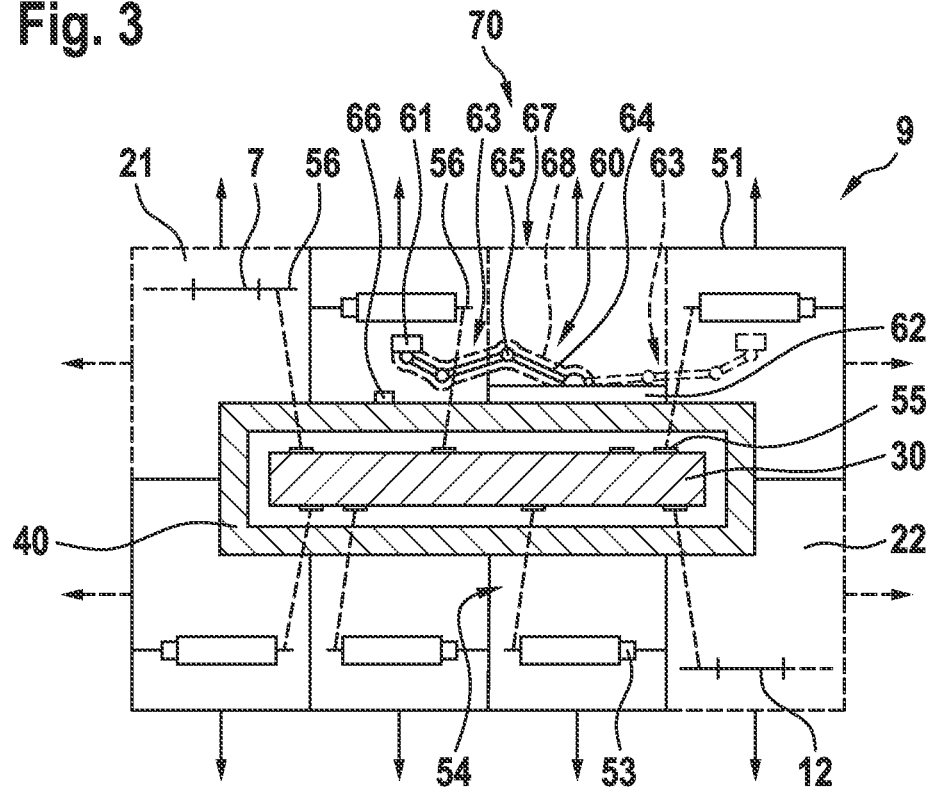
FIG. 3 shows the schematic set-up of an arrangement for semiconductor lithography.

FIG. 3 shows, in a sectional illustration, an arrangement 70 according to the disclosure for semiconductor lithography, illustrated in a correspondingly modified projection optical unit 9. In comparison with the projection optical unit 9 illustrated in FIG. 2, a module 50 has been removed and in its place, at the same screw attachment points (not illustrated) of the module 50, a service module 60 has been connected to the carrying frame 40. The service module 60 comprises a basic framework 62 with a robot arm 63, which comprises a plurality of sub-arms 64.x and joints 65.x and, as end effector, a service head 61.

After the service module 60 has been installed, it is referenced with the aid of a reference mark 66 arranged on the carrying frame 40, that is to say that its relative position with respect to the reference mark 66 is determined. The reference mark 66 can be the same reference mark 66 that is also used for positioning the modules 50. The reference mark can be embodied for example as a mechanical or an optical reference mark 66. After referencing, the position of the reference mark 66 and thus the position of the other mirrors 52 and component parts 53, 55, 56 are known in the coordinate system of the service module 60.

The controller (not illustrated) of the service module 60 can then move the robot arm 63 without any risk of a collision in the projection optical unit 9. This may involve moving the mirrors 52, the reticle 7 and/or the wafer 12 into a service position. Depending on the set-up of the projection optical unit 9, the service module 60 can reach a plurality of mirrors 52 of other modules 50, which is illustrated in FIG. 3 by the illustration of a second position of the robot arm 63 using dashed lines. The service head 61 is exchangeable, such that various embodiments with different functions can carry out the various tasks during the maintenance of the projection optical unit 9. In this case, the service heads 61 can fulfil a multiplicity of different functions besides examination of the mirrors 52 via an interferometer or removal of deposits on the mirrors 52 via plasma or removal of particles through to checking for cracks on the carrying frame 40 or exchange of an actuator 53 or sensor 54. In general, all tasks that can be realized via a service head 61 can be carried out by the service module 60. Some of these tasks, such as plasma cleaning, for example, can be carried out only in a vacuum environment, for which reason the remaining opening in the projection optical unit 9 can optionally be closed by a sealing bell 67 (illustrated in a dashed manner). As a result, a vacuum can be established in the projection optical unit 9, in a manner comparable to the operating state of the projection exposure apparatus 1 in FIG. 1. For protection against particles, the robot arm 63 can be enclosed by an elastic sheath 68 (illustrated in a dashed manner), such that no particles generated by the moving parts 64, 65, for example by the joints 65, can pass into the interior of the projection exposure apparatus 1. In general, the service module 60 can also be arranged outside the projection optical unit 9 or even outside the projection exposure apparatus 1 illustrated in FIG. 1, as long as referencing to the reference mark 66 in the projection exposure apparatus 1 or the projection optical unit 9 is possible.

Figure 4A:
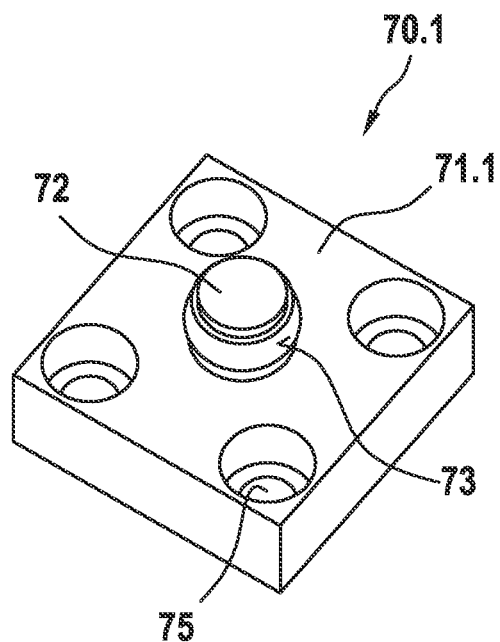
FIGS. 4A and 4B show an exemplary embodiment of a ball-socket interface which can be employed in an implementation of the disclosure.
Figure 4B:
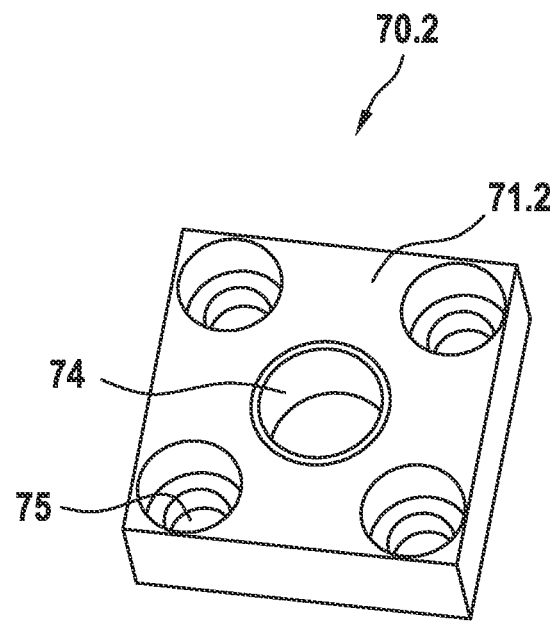

FIGS. 4A and 4B show the two component parts 70.x of a ball-socket interface, in which the first part 70.1 corresponds to a reference mark 66 of a carrying frame 40 illustrated in FIG. 3.

The first part of the interface as illustrated in FIG. 4A comprises a plate 71.1 having four securing holes 75, which serve for fixing the plate 71.1 on the carrying frame 40 (not illustrated). Furthermore, the plate 71.1 comprises a pin 72 with spherical piece 73, the pin being arranged in the centre of the plate 71.1 in this example. The position and orientation of the plate 71.1 on the carrying frame 40 are attained via spacers (not illustrated) arranged on the rear side situated opposite the pin 72 and at the side surfaces of the plate 71.1. The spherical piece 73 is a segment of a ball, which segment is arranged on the lateral surface of the pin 72 and facilitates the introduction of the counterpart 70.2 (see FIG. 4B) and defines a very accurate reference in the plane by way of the maximum diameter of the spherical piece 73. The catching region of such a pin 72 with spherical piece 73 is in the region of 2 mm, wherein the positioning accuracy after the two parts 70.1, 70.2 of the ball-socket interface have been joined can be 20 μm.

FIG. 4B shows the second part 70.2 of the ball-socket interface, the second part comprising a plate 71.2 with a socket 74. The plate 71.2 likewise comprises four securing holes 75 for fixing the plate 71.2 to one of the modules 21, 22, 50 described in FIG. 3 or to the service module 60. In contrast to the first part 70.1 of the ball-socket interface serving as reference element 66, as described in FIG. 4A, the second part 70.2 is not positioned by way of spacers and, for its part, serves as a reference for other reference marks of the modules 21, 22, 50 or of the service module 60, which determine for example the position of the mirrors 52 (not illustrated). In this example, therefore, as described in detail in FIG. 3, the service module 60 uses the mechanical reference mark 66 of the module 50 removed for the service module 60 for the purpose of referencing to the projection exposure apparatus 1, 101.

FIG. 5 shows a method for maintaining a projection exposure apparatus comprising at least two modules 50 and a reference element 30, 40, and wherein the modules 50 are referenced to the reference element 30, 40, having the following method steps:

In a first method step 81, a module 50 is removed.

In a second method step 82, a service module 60 is attached to or in the vicinity of the projection exposure apparatus 1.

In a third method step 83, the service module 60 is referenced to a reference element 30, of the projection exposure apparatus 1.

In a fourth method step 84, a maintenance measure is implemented with the aid of the service module 60.

LIST OF REFERENCE SIGNS

1 Projection exposure apparatus
2 Field facet mirror
3 Light source
4 Illumination optical unit
Object field
6 Object plane
7 Reticle
8 Reticle holder
9 Projection optical unit
10 Image field
11 Image plane
12 Wafer
13 Wafer holder
14 EUV radiation
15 Intermediate field focal plane
16 Pupil facet mirror
17 Assembly
18 Mirror
19 Mirror
20 Mirror
21 Reticle module
22 Wafer module
30 Sensor frame
40 Carrying frame
50 Optical module
51 Module carrying frame
52 Mirror
53 Actuator
54 Sensor
55 Sensor reference
56 Sensor element
60 Service module
61 Service head
62 Basic framework
63 Arm
64 Sub-arm
65 Joint
66 Reference mark
67 Scaling bell
68 Elastic sheath
70.x Reference, stop
71.x Plate
72 Pin
73 Spherical surface
74 Socket
75 Securing hole
80 Arrangement
81 Method step 1
82 Method step 2
83 Method step 3
84 Method step 4

What is claimed is:

1. A method of maintaining a projection exposure apparatus comprising first and second modules and a reference element to which the first and second modules are referenced, the method comprising:
   removing the first module;
   attaching a service module to or in a vicinity of the projection exposure apparatus;
   referencing the service module to the reference element; and
   using the service module to implement a maintenance measure of the projection exposure apparatus.

2. The method of claim 1, wherein the projection exposure apparatus comprise a projection optical unit and an illumination optical unit, and the first and second modules are components of the projection optical unit or the illumination optical unit.

3. The method of claim 1, wherein referencing the service module comprises using a reference mark of the projection exposure apparatus.

4. The method of claim 1, wherein referencing the service module comprises using a reference mark of the first module.

5. The method of claim 1, wherein removing the first module makes the second module accessible for inspection.

6. The method of claim 1, further comprising exchange the service module for implementing different maintenance measures.

7. The method of claim 1, wherein the maintenance measures comprise examination of contamination performed using at least one member selected from the group consisting of X-ray fluorescence, atomic force microscopy, optical microscopy, removal of particles or deposits from optical surfaces, interferometer measurement, non-contact detection of mechanical stresses or strains, non-contact and/or non-destructive material testing, corrosion testing or crack detection of frame parts of the carrying structures, and detection of the reference mark.

8. The method of claim 1, further comprising a sealing bell to enclose the service module to seal the projection exposure apparatus in a vacuum-tight manner.

9. The method of claim 8, wherein at least one of the following holds:
   a weight of the service module corresponds to a weight of the first module;
   moments of inertia of the service module correspond to moments of inertia of the first module;
   a weight of the sealing bell corresponds to a weight of the first module; and
   moments of inertia of the sealing bell correspond to moments of inertia of the first module.

10. A service module configured to maintain or inspect components of a projection exposure apparatus for semiconductor lithography, the service module comprising:
   a device configured to detect a reference mark of the projection exposure apparatus to determine a position of the reference mark in a coordinate system of the service module.

11. The service module of claim 10, wherein the device comprises a member selected from the group consisting of a camera, a probe head, and an exchangeable service head.

12. The service module of claim 10, wherein the device comprises a service head.

13. The service module of claim 10, further comprising a robot arm.

14. The service module of claim 13, further comprising an elastic sheath at least partially enclosing the robot arm.

15. The service module of claim 10, wherein the reference mark comprises a component of a ball and socket interface.

16. The service module of claim 15, wherein the component comprises a pin.

17. An arrangement for a semiconductor projection exposure apparatus, the arrangement comprising:
   first and second modules;
   a reference element to which the first and second modules are referenced; and
   a service module referenced to the reference element, wherein:
      each of the first module, the second module and the service module is referenced to the reference element; and
      the arrangement is a semiconductor lithography arrangement.

18. The arrangement of claim 17, wherein the semiconductor projection exposure apparatus comprises a mark to reference the service module to the reference element.

19. The arrangement of claim 18, wherein the reference mark comprises at least one member selected from the group consisting of a mechanical reference mark and an optical reference mark.

20. The arrangement of claim 18, wherein the reference mark corresponds to a reference mark to position the first and second modules.

21. The arrangement of claim 20, wherein the reference mark comprises a ball-hole interface.

22. The arrangement of claim 17, further comprising a carrying frame for the first and second modules, wherein the service module is supported by the carrying frame.

* * * * *

UNITED STATES PATENT AND TRADEMARK OFFICE
CERTIFICATE OF CORRECTION

PATENT NO. : 12,332,576 B2
APPLICATION NO. : 17/986517
DATED : June 17, 2025
INVENTOR(S) : Dirk Heinrich Ehm et al.

It is certified that error appears in the above-identified patent and that said Letters Patent is hereby corrected as shown below:

In the Specification

Column 9, Line 2, after "30," insert -- 40 --.

Column 9, Line 13, before "Object field" insert -- 5 --.

Column 9, Line 47, delete "Scaling" and insert -- Sealing --.

Signed and Sealed this
Twenty-ninth Day of July, 2025

Coke Morgan Stewart
*Acting Director of the United States Patent and Trademark Office*